United States Patent
Ahmed et al.

(10) Patent No.: US 10,438,636 B2
(45) Date of Patent: Oct. 8, 2019

(54) CAPACITIVE STRUCTURE FOR MEMORY WRITE ASSIST

(71) Applicant: ADVANCED MICRO DEVICES, INC., Santa Clara, CA (US)

(72) Inventors: Tawfik Ahmed, Austin, TX (US); Amlan Ghosh, Austin, TX (US); Keith A. Kasprak, Austin, TX (US); Ricardo Cantu, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/834,644

(22) Filed: Dec. 7, 2017

(65) Prior Publication Data

US 2019/0180798 A1  Jun. 13, 2019

(51) Int. Cl.
| | | |
|---|---|---|
| G11C 7/12 | (2006.01) | |
| H01L 23/522 | (2006.01) | |
| G11C 7/10 | (2006.01) | |
| G11C 5/06 | (2006.01) | |

(52) U.S. Cl.
CPC ............ *G11C 7/12* (2013.01); *G11C 5/06* (2013.01); *G11C 7/1096* (2013.01); *H01L 23/5223* (2013.01)

(58) Field of Classification Search
CPC .................................. G11C 5/06; G11C 8/10
USPC ................................ 365/63, 230.03
See application file for complete search history.

(56) References Cited

U.S. PATENT DOCUMENTS

| | | | | |
|---|---|---|---|---|
| 5,097,441 | A * | 3/1992 | Cho ................. | G11C 5/063 |
| | | | | 257/E23.144 |
| 5,949,708 | A * | 9/1999 | Chevallier ......... | H02M 3/073 |
| | | | | 365/100 |
| 9,218,872 | B1 * | 12/2015 | Liaw ................ | G11C 11/412 |
| 9,865,311 | B1 * | 1/2018 | Sakui ............... | G11C 16/0483 |
| 2003/0147278 | A1 * | 8/2003 | Tanaka .............. | G11C 11/5628 |
| | | | | 365/185.03 |
| 2004/0060031 | A1 * | 3/2004 | Cernea .............. | G11C 7/06 |
| | | | | 365/185.23 |
| 2005/0122780 | A1 * | 6/2005 | Chen ................ | G11C 11/5671 |
| | | | | 365/185.17 |
| 2006/0245254 | A1 * | 11/2006 | Ishii ................ | G11C 16/344 |
| | | | | 365/185.18 |
| 2009/0052259 | A1 * | 2/2009 | Arigane ............. | G11C 5/025 |
| | | | | 365/185.29 |
| 2009/0080265 | A1 * | 3/2009 | Mokhlesi ........... | G11C 7/12 |
| | | | | 365/185.23 |
| 2011/0255328 | A1 * | 10/2011 | Murakuki ........... | H01L 27/105 |
| | | | | 365/145 |

(Continued)

*Primary Examiner* — Michael T Tran

(57) ABSTRACT

Write assist circuitry facilitates increased voltage applied to a memory device such as a memory cell or bitcell in changing a logical state of the memory device during a write operation. The write assist circuitry includes a second capacitive line or "metal cap" in addition to a first capacitive line coupled to one of a pair of bitlines to which voltage may be selectively applied. The capacitive lines provide increased write assistance to the memory device. The second capacitive line structurally lies in a second orientation and is formed in an integrated circuit second metal layer relative to the first capacitive line in some embodiments. The additional capacitive line provides negative bitline assistance by selectively driving its corresponding bitlines to be negative during a write operation.

16 Claims, 3 Drawing Sheets

(56) References Cited

U.S. PATENT DOCUMENTS

| | | | |
|---|---|---|---|
| 2013/0051152 A1* | 2/2013 | Lee | G11C 16/0483 365/185.18 |
| 2013/0250652 A1* | 9/2013 | Toda | G11C 13/0069 365/148 |
| 2013/0272049 A1* | 10/2013 | Vogt | G11C 5/06 365/63 |
| 2014/0056055 A1* | 2/2014 | Ikeda | G11C 13/00 365/148 |
| 2014/0104930 A1* | 4/2014 | Deguchi | G11C 13/0007 365/148 |
| 2014/0169106 A1 | 6/2014 | Kolar et al. | |
| 2014/0241026 A1* | 8/2014 | Tanzawa | G11C 5/063 365/72 |
| 2014/0340964 A1* | 11/2014 | Shiino | G11C 16/26 365/185.03 |
| 2015/0023100 A1* | 1/2015 | Huynh | G11C 16/12 365/185.05 |
| 2015/0071019 A1* | 3/2015 | Toda | G11C 8/08 365/230.03 |
| 2015/0287460 A1* | 10/2015 | Lee | G11C 13/0069 365/148 |
| 2015/0325283 A1* | 11/2015 | Takahashi | H01L 27/10814 365/51 |
| 2016/0163396 A1* | 6/2016 | Pan | G11C 16/30 365/185.18 |
| 2016/0203857 A1 | 7/2016 | Chandra et al. | |
| 2016/0232966 A1 | 8/2016 | Chandra et al. | |
| 2016/0267952 A1 | 9/2016 | Kolar et al. | |
| 2016/0351254 A1* | 12/2016 | Li | G11C 11/5628 |
| 2017/0004876 A1 | 1/2017 | Chandra et al. | |
| 2017/0092352 A1* | 3/2017 | Sano | G11C 7/12 |
| 2017/0117034 A1 | 4/2017 | Hebig et al. | |
| 2017/0133077 A1* | 5/2017 | Carver | G11C 11/406 |
| 2017/0309819 A1* | 10/2017 | Wu | H01L 45/146 |
| 2018/0137922 A1* | 5/2018 | Sakui | G11C 16/08 |
| 2018/0300265 A1* | 10/2018 | Roberts | G06F 13/161 |

* cited by examiner

CAPACITIVE STRUCTURE FOR MEMORY WRITE ASSIST

BACKGROUND

Bitlines are conductive lines or traces that couple a memory cell write driver to memory cells. In static read access memories (SRAMs) and other memories, conventional negative bitline write assist (NBWA) circuits use a pull-down voltage to provide a negative voltage supply or a negative ground reference for a write driver on one of the bitlines. Such techniques are useful in writing a zero ("0") value into a memory cell that is storing a one ("1") value at a first time and writing a zero ("0") value at a second time. Conventional NBWA circuits often include a bias capacitor configured to provide the ground reference. However, as such bias capacitors consume significant space, and as floorplan space on an integrated circuit is limited, it is often impracticable to provide sufficient capacitance via such conventional bias capacitors.

BRIEF DESCRIPTION OF THE DRAWINGS

The present disclosure is better understood, and its numerous features and advantages made apparent to those skilled in the art by referencing the accompanying drawings. The use of the same reference symbols in different drawings indicates similar or identical items.

DETAILED DESCRIPTION

Ever increasing memory requirements have led to placing a large number of memory cells on an integrated circuit (IC) or system on a chip (SOC). A memory device includes an array of memory cells arranged in columns and rows in silicon. For convenience, physical columns of memory cells are often grouped into logical columns of memory cells. Column circuitry and row circuitry facilitate access to individual memory cells. A column of memory cells or a row of memory cells represents a string of data bits. These memory cells include structures configured to store one or more bits of information. A memory cell is also referred to herein as a bitcell. Many memory architectures implemented by such memory devices use bitline pairs, a bitline (BL) and its complement bitline (/BL), to electrically couple each of a set (i.e., column) of memory cells in parallel across the bitline pair to read and write memory cell contents. A write driver applies a voltage across the bitlines of a corresponding bitline pair to write a corresponding value into the memory cell. To provide an extra amount of capacitance to a write driver, an additional capacitance line or "cap" line is added to memory architectures as further described herein.

According to some embodiments, a second cap line is substantially orthogonal to a first cap line.

The additional cap line provides benefits to memory architectures and memory circuits. For large ICs and SOCs, a relatively high statistical variation in "writeability" occurs among memory cells on a processed silicon wafer because, for a variety of reasons, some memory cells are weaker and more difficult to write than other memory cells. If a memory cell is more difficult to write, the memory cell may not be successfully written with a typical voltage Vdd applied on a bitline pair. A low power supply voltage can exacerbate this problem. The ability to write to memory cells is improved by boosting an applied voltage below a ground potential—a negative boost to the voltage applied on the bitline pair. In the described memory architectures, for improved negative boosting, one or more additional cap lines or cap line structures are coupled to one or both the bitline and its bitline complement. The write driver selectively applies the capacitive boost from the additional cap line structures during a write operation. While reference may be made to applying the additional cap to the bitlines, during a write operation, the cap often is applied to a write data line since the write data line also often is electrically coupled to the memory cell at a same time that the bitlines are coupled to the memory cell.

Figure 1:
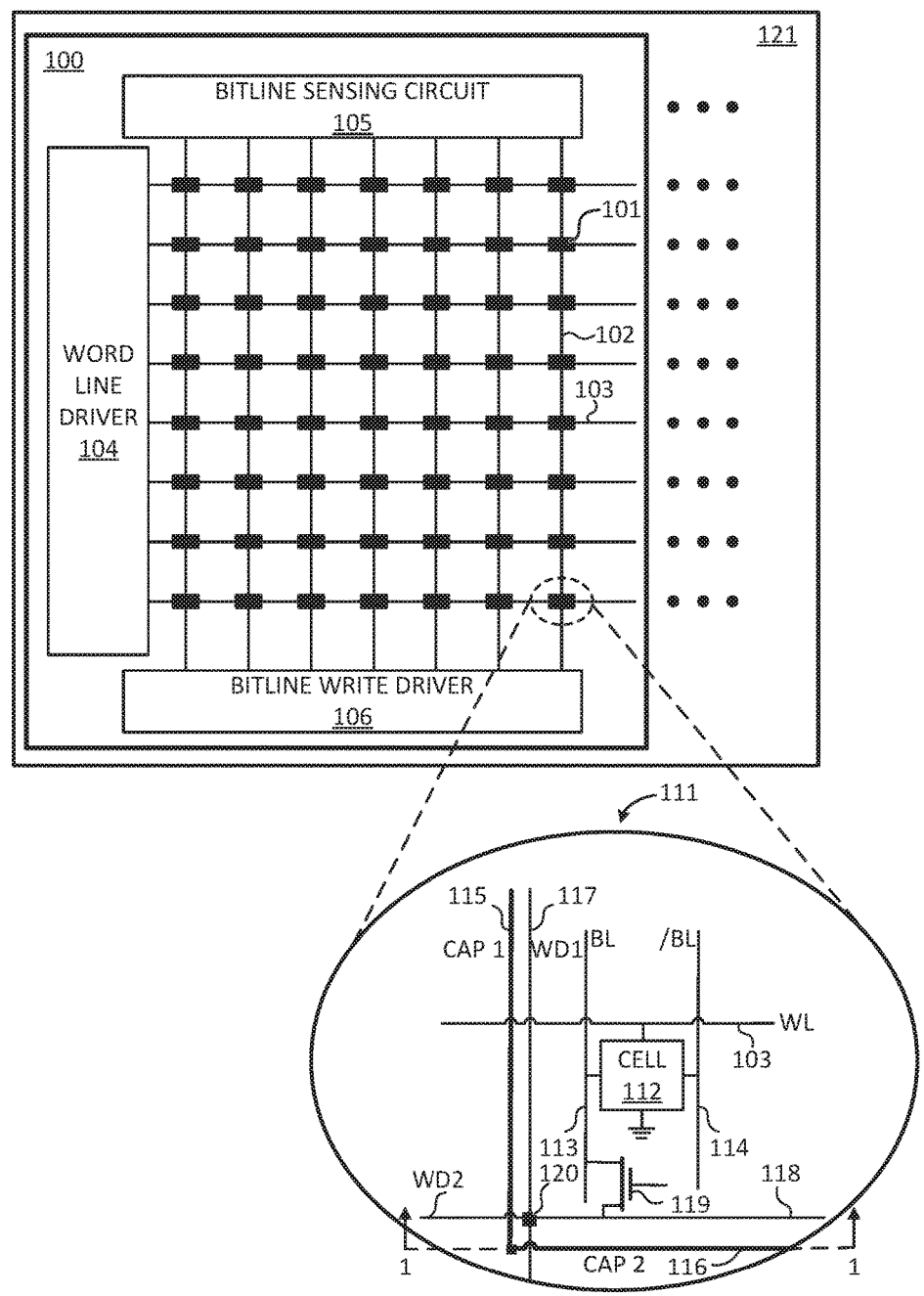
FIG. 1 is a block diagram of an array of capacitive structures and memory cells in accordance with some embodiments.

FIG. 1 is a block diagram of an array of capacitive structures and memory cells in accordance with some embodiments. A memory device 100 includes columns and rows of memory cells 101. According to some embodiments, the memory device 100 is implemented on an integrated circuit (IC) die. That is, according to some embodiments, the memory device 100 is part of an IC die 121. In various embodiments, the memory cells 101 are implemented as one or more of: static random access memory (SRAM) cells implemented with field effect transistors (FETs), dynamic static random access memory (DRAM) cells implemented with capacitors, or other type of memory cells known in the art.

Each of the memory cells 101 is accessed by a respective bitline 102 and a word line 103. In a two-stage read or write operation, a row of memory cells 101 is first activated through a respective word line 103 by a word line driver 104 and then activated through a bitline 102 by a bitline write driver 106 for each write operation. In some embodiments, each memory cell 101 is accessed by a bitline sensing circuit 105 as part of a read operation. For sake of simplicity of illustration, a single bitline 102 is shown for each column of memory cells 101. As shown in the callout 111, each bitline 102 is actually a bitline pair: a bitline 113 (first bitline) and a bitline complement 114 (second bitline), as further explained herein. The word line driver 104 is configured to selectively activate one row of the memory cells 101 for a particular operation by way of a word line 103. An activated bitline 102 is only able to access the memory cell 101 in the activated row since only one row at a time activated for a write operation. The bitlines 102 and the word lines 103 are conductive lines or traces configured to provide a low resistance path between the bitline write driver 106 and the word line driver 104, respectively.

In the callout 111, further details of a memory cell 101 and capacitive structures are shown. A first bitline 113 is labeled "BL," and a second bitline 114 is labeled "/BL." The second bitline 114 is the bitline complement of the first bitline 113. A first capacitive line structure 115 labeled "CAP 1" lies parallel with the first bitline 113 and a first write data (WD1) line 117 labeled "WD1" on a first side of the memory cell 112. A second capacitive line structure 116 labeled "CAP 2"

lies parallel with a second write data (WD2) line 118 on a second side of the memory cell 112. The word line 103 is labeled "WL." The WD2 line 118 lies on a third side of the memory cell 112. According to some embodiments, and as illustrated in FIG. 1, the second capacitive line structure 116 is coupled to the first capacitive line structure 115 by a conductive via 120. The via 120 is composed of a conductive material and configured to provide a low resistance path between the first (column) capacitive line structure 115 and the second (row) capacitive line structure 116.

In the callout 111, while the first bitline 113 lies between the first capacitive line structure 115 and the memory cell 112, in other embodiments, the first capacitive line structure 115 runs between the first bitline 113 and the first side of the memory cell 112. In yet other embodiments, the first capacitive line structure 115 runs parallel to the second bitline 114. According to some embodiments, a first capacitive line structure 115 is provided for each column of memory cells 101 in the memory device 100, and a second capacitive line structure 116 is provided for each word line 103 in the memory device 100. In such an embodiment, each memory cell 112 is provided with a pair of cap. lines 115, 116.

According to some embodiments, in a write operation, the word line 103 is activated with a memory write voltage source, and then the first bitline 113 and the second bitline 114 are activated by having the bitline write driver 106 coupling the bitline 113 or bitline compliment 114 to the memory write voltage source. According to some embodiments, during this write operation, the word line 103 is disconnected from the memory write voltage. Then, the first capacitive line structure 115 or the second capacitive line structure 116 is coupled to one of either the first bitline 113 or the bitline complement 114 such as through a coupling transistor 119 to provide a capacitive coupling or capacitive boost to the memory cell 112. The bitline write driver 106 performs the capacitive coupling by activating the coupling transistor 119. According to some embodiments, the coupling transistor 119 is a component of the bitline write driver 106 but alternatively is a component of the write data line driver 104. In the callout 111, when activated, the bitline write assist is provided by a structure that includes a combination of the first capacitive line structure 115 and the second capacitive line structure 116.

According to some embodiments, the bitline write driver 106 includes a charge pump (not shown) coupled to the first capacitive line structure 115. The charge pump generates a negative voltage and continually maintains a predetermined voltage level on the first capacitive line structure 115. During a stage of the write operation, the bitline write driver 106 provides control signals that cause one of the bitlines 113, 114 to be first pulled to ground, or some other predetermined reference voltage, and then to a relatively negative voltage, for example, to negative 150 millivolts (mV) when providing a negative bitline write assist to the memory cell 112.

The negative bitline write assist is used, for example, when writing a LOW value in a write operation when the memory cell 112 holds a HIGH value. For example, when writing to the memory cell 112, a logic level HIGH corresponds to, for example and without limitation, any one of a voltage in the range of 0.5 to 1 volts, 0.7 to 1.2 volts, 1 to 2 volts, 1 to 3 volts, 3 to 15 volts, or other voltage or other signal level. A logic level LOW corresponds to, for example and without limitation, any one of a voltage in the range of 0 to 0.5 volts, −0.1 to 0.4 volts, −1.5 to 0 volts, or other voltage or other signal level. In general, according to some embodiments, one of the bitlines 113, 114 is coupled to the first capacitive line structure 115 in order to facilitate the negative bitline write assist. The second capacitive line structure 116 provides increased capacity to store charge during the write operation to the memory cell 112.

According to other embodiments, when the memory cell 112 is a DRAM type of memory cell, the increased capacity of the second capacitive line structure 116 coupled to the first capacitive line structure 115 assists in absorbing negative charge when the memory cell 112 is charged with a "1" value as known to those in the art. During the write operation, activation of the coupling transistor 119 parasitically exposes the memory cell 112 to a combination of the first capacitive line structure 115 and the second capacitive line structure 116 which more effectively discharges a stored charge from the memory cell 112 as compared to use of just the first capacitive line structure 115. Subsequently, the bitline write driver 106 applies a write voltage to one of the bitlines 113, 114. The subsequently applied write voltage is thus more likely to successfully change the value stored in the memory cell 112.

The first capacitive line structure 115 is an example of a capacitive line structure for the memory device 100 that includes one or more metal lines or traces implemented at one or more metal layers of an IC die, the IC die 121 of the memory device 100 being fabricated with a plurality of metal layers interposed with insulative layers as known in the art, the metal layers and insulative layers being types of device layers for the memory device 100. In FIG. 1, according to some embodiments, the first capacitive line structure 115 is in a first metal layer, and the second capacitive line structure 116 is in a second metal layer of the memory device 100. Further, the first capacitive line structure 115 is in a first orientation or a first direction in the IC die 121, and the second capacitive line structure 116 is in a different, second orientation or a second direction in the memory device 100. Where space in the memory device 100 is at a premium, the available capacitance is enhanced by electrically coupling column and row capacitive line structures 115, 116 so that they form a larger overall capacitive structure than found in conventional memory structures. In particular, the capacitance provided by a capacitive structure formed from the capacitive line structures 115, 116 is a function of an overall length, a width, and a thickness of the capacitive line structures 115, 116 and of each of the write data lines 117, 118. In some embodiments, a capacitive behavior of the memory device 100 is enhanced beyond conventional memory structures by capacitively coupling the first bitline 113 to the first capacitive line structure 115 which in turn is coupled to the second capacitive line structure 116 by the via 120.

Capacitance present on one or more capacitive line structures, such as capacitive line structures 115, 116, at least partially determines a maximum frequency at which the memory cell 112 can be operated. According to some embodiments, a higher capacitance in the combination of the first capacitive line structure 115 and the second capacitive line structure 116 corresponds with a higher resistance-capacitance (RC) time constant corresponding to slower charge and discharge times for one or more of the bitlines 113, 114. As a result, overall available capacitance defines a frequency at which data bits are delivered to the memory cell 112 via the bitlines 113, 114 and thereby defines a speed of operating write cycles of the memory cell 112. Consequently, designing and fabricating capacitive line structures 115, 116 to have certain characteristics that enhance the efficiency and effectiveness of write operations of a memory device having memory cells such as the memory device 100 having the memory cell 112.

Figure 2:
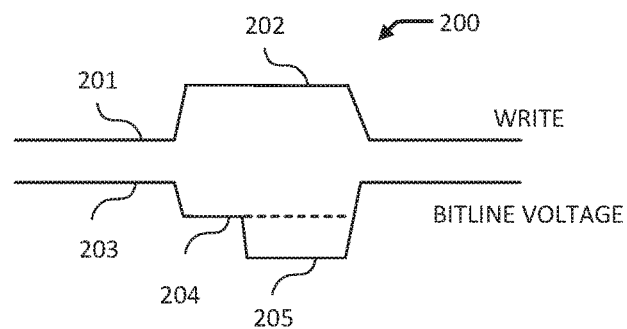
FIG. 2 is a diagram of voltages when coupling capacitive structures to a memory cell in accordance with some embodiments.

FIG. 2 is a diagram 200 of voltages when coupling capacitive structures to a memory cell in accordance with some embodiments. During a write operation, a write signal ("WRITE") changes from a first value 201 to a second value 202. In the write operation, a word line is activated, and then a bitline and its bitline complement are activated. According to some embodiments, during this write operation, a bitline write driver performs a two-stage capacitive boost by coupling a first capacitive line structure to the bitline to provide a first capacitive boost, a first negative bitline write assist, to a memory cell, and then coupling a second capacitive line structure to the bitline to provide a second capacitive boost. In other embodiments, during a write operation, both a first and a second capacitive line structure are electrically coupled, and then at a designated time, are coupled to the bitline.

Applying the two-stage capacitive boost, a bias capacitance voltage ("BIAS_CAP_OUT") at the memory cell goes from a first capacitive value 203 to a second capacitive value 204. The bitline write driver performs the first capacitive coupling by activating, for example, a first coupling transistor. According to further embodiments, during the write operation, the bitline write driver couples the second capacitive line structure to the bitline to provide a second capacitive boost, a second negative bitline write assist, to the memory cell. The bias capacitance voltage at the memory cell goes from the second capacitive value 204 to a third capacitive value 205. In FIG. 2, the capacitive boosting is in addition to, and after, writing a value to the memory cell.

Figure 3:
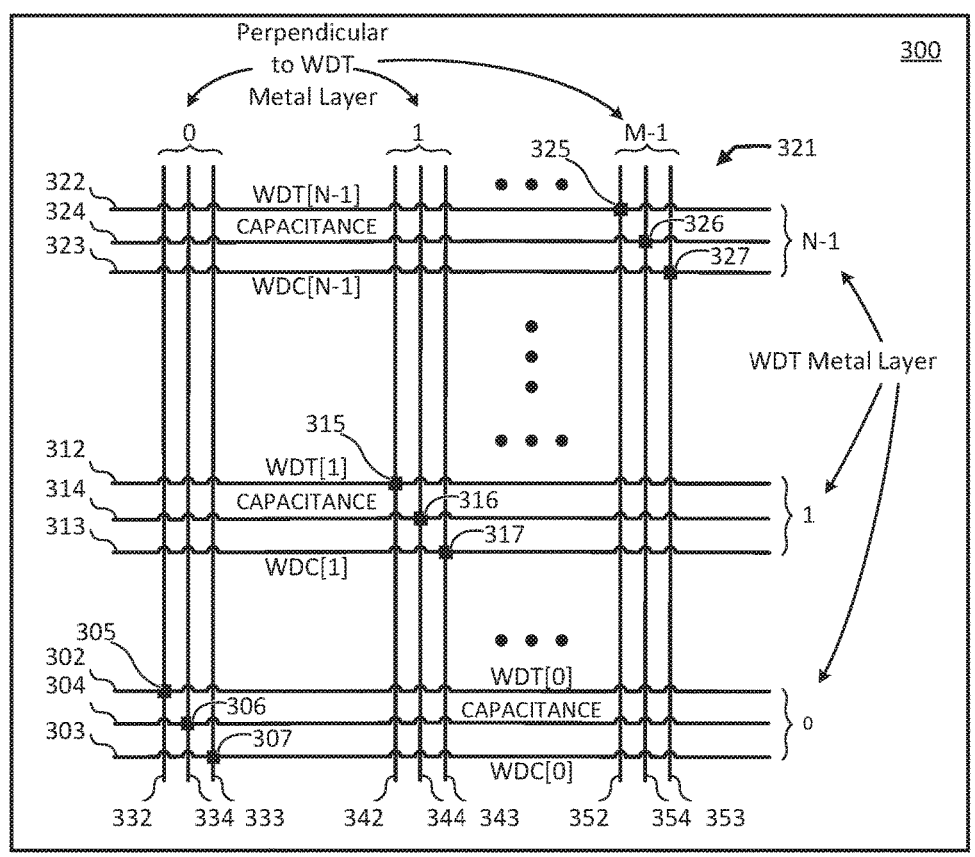
FIG. 3 is a block diagram of a two-dimensional array of capacitive structures for memory cells in accordance with some embodiments.

FIG. 3 is a block diagram of a circuit 300 comprising two-dimensional array of capacitive structures for memory cells in accordance with some embodiments. The circuit 300 includes a two-dimensional array of capacitive line structures for memory cells arranged in rows numbered 0 to N−1 and vertical columns 0 to M−1. For each row, a first capacitive line structure extending in first orientation (e.g., in row[0]) is electrically coupled by a via to a second capacitive line structure (e.g., in column[0]). For sake of clarity in illustration, the memory cells are omitted but bitlines and capacitive line structures are shown and would be coupled to memory cells or bitcells as shown, for example, in the callout 111 of FIG. 1 and in FIG. 2 as known in the art. The first column [0] corresponds to a first column of memory cells coupled to columns of word lines and available capacitive structures. In operation, a word line driver would be coupled to the rows [0] to [M−1] of word lines and is configured to identify one of the rows of memory cells for a write operation based on a row selector component receiving a row select signal. Further, a bitline write driver would be coupled to the columns of word lines and is configured to identify one of the columns of memory cells for a write operation based on a column selector component receiving a column select signal. The bitline write driver would then be able to employ the capacitive line structures for write operations as further described herein.

A first row [0] of write data lines 302, 303 (labeled "WDT[0]" and "WDC[0]") is split by a first capacitive line structure 304 labeled as "capacitance." In other embodiments, the first capacitive line structure 304 is positioned proximate to the first write data line WDT 302, the first write data line complement WDC 303, or both the first write data line WDT 302 and the first write data line complement WDC 303. A second row [1] of write data lines 312, 313 (labeled "WDT[1]" and "WDC[1]") is split by a first capacitive line structure 314. In other embodiments, the first capacitive line structure 314 in the second row [1] is positioned proximate to the second write data line WDT 312, the second write data line complement WDC 313, or both the second write data line WDT 312 and the second write data line complement WDC 313 of the second row. A third row [N−1] of write data lines 322, 323 (labeled "WDT[N−1]" and "WDC[N−1]") is split by a first capacitive line structure 324. In other embodiments, the first capacitive line structure 324 of the third row is positioned proximate to the third write data line WDT 322, the third write data line complement WDC 323, or both the third write data line WDT 322 and the third write data line complement WDC 323 of the third row. The third row represents an Nth number of rows illustrating that any numbers of rows of memory cells are arranged in a circuit such as circuit 300 of FIG. 3.

Crossing the first write data lines 302, 303 are a first vertical column [0] of write data lines 332, 333 and a first of a second capacitive line structure 334. Any number of columns such as rows 0,1 and M−1 of write data lines and second capacitive line structures may cross, and couple to as needed, respectively the first write data lines 302, 303, the second write data lines 312, 313, and the third write data lines 322, 323 and corresponding first capacitive line structures 304, 314, and 324. For example, in the second column [1], write data lines 342, 343 and capacitive line structure 344 cross: (1) the first write data lines 302, 303 and the first capacitive line structure 304; (2) the second write data lines 312, 313 and the second capacitive line structure 314; and (3) the third write data lines 322, 323 and the third capacitive line structure 324.

In the circuit 300, the first set of write data lines 332, 333 cross the second and third set of write data lines 312, 313 and 322, 323, respectively, but do not electrically couple to these second and third write data lines. Instead, only the first row of write data lines 302, 303 are electrically coupled to first set of write data lines 332, 333 by vias 305, 307. Similarly, the second capacitive line structure 334 of the first column [0] does not electrically couple to the second and third capacitive line structures 314, 324. Instead, only the first capacitive line structure 304 is electrically coupled to the first vertical "second" capacitive line structure 334 by a via 306 thereby providing an increased amount of capacitance for the write data lines 332, 333. This same scheme applies to the second set of write data lines 342, 343 and the second capacitive line structure 344 by vias 315, 316, 317 where these structures of the second column [1] are only coupled to the respective structures of the second row of structures 312-314 and cross—without electrical connection—the other columns of structures. This scheme is repeated for the last column of write data lines 352, 353 and second capacitive line structure 354 where these structures of the last column [M−1] are only coupled to the respective structures of the last row [N−1] of structures 322-324 by vias 325, 326, 327 and cross—without electrical connection—the other columns of structures. Only one set of vias is applied to the lines at each row/column combination such as along the diagonal from bottom left to top right in FIG. 3. In summary, and according to the embodiment shown, one column of a set of structures is only electrically coupled to one row of a set of structures. According to some embodiments, the electrical structures of the columns are formed at a different layer than the electrical structures of the rows.

In FIG. 3, the first capacitive line structures 304, 314, and 324 extend substantially all of a first length along a first direction of the circuit 300, and the second capacitive line structures 334, 344, and 354 extend substantially all of a second length along a second direction of the circuit 300. The multiple second capacitive structures 334, 344, 354 of the multiple rows 0 through M−1 provide increased capacitance to the circuit 300 to one or more of the respective memory cells coupled to write data lines 302, 303, 312, 313, 323, 324 and write data lines 332, 333, 342, 343, 352, 353 when activated by a write data line controller (not illustrated) and a bitline write controller (not illustrated). In operation, according to some embodiments, when a memory cell is activated, a capacitive boost is applied to all columns when the capacitive boost is turned on. According to other embodiments, the capacitive boost is applied to a single column such as at a first set of write data lines 332, 333.

The write data lines 332, 342, and 352, are arranged in a second orientation (e.g., top-to-bottom, bottom-to-top, vertical orientation) with respect to the write data lines 302, 312, and 322. Similarly, the write data line complements 333, 343, and 353, are arranged in a second orientation (e.g., top-to-bottom, bottom-to-top, vertical orientation) with respect to the write data line complements 303, 313, and 323. Yet further, the second capacitive line structures 334, 344, and 354, are arranged in a second orientation (e.g., top-to-bottom, bottom-to-top, vertical orientation) with respect to the first capacitive line structures 304, 314, and 324 that are arranged in a first orientation (e.g., left-to-right, right-to-left, horizontal orientation).

Figure 4:
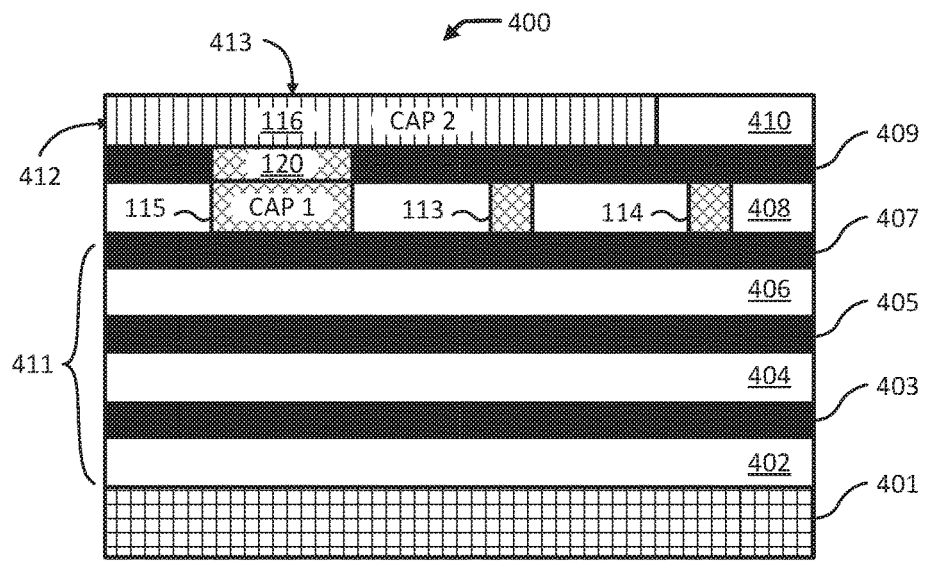
FIG. 4 is a block diagram of a cross-sectional view along line 1-1 of FIG. 1 in accordance with some embodiments.

According to some embodiments, the write data lines 332, 342, and 352, the write data line complements 333, 343, and 353, and the second capacitive line structures 334, 344, 354 are arranged in a substantially coplanar second layer such as in a (WDT) second metal layer (e.g., metal 3 (M3), metal 4 (M4), metal 5 (M5)) as further described in relation to FIG. 4. According to some embodiments, the second capacitive line structures 334, 344, 354 are arranged substantially orthogonal or perpendicular to the first capacitive line structures 304, 314, 324. In FIG. 3, while the second capacitive line structures 334, 344, and 354 are illustrated as metal lines, in other embodiments the second capacitive line structures 334, 344, and 354 are made of other materials and are part of another type of layer as known to those in the art. While illustrated as lines, the second capacitive line structures 334, 344, and 354, in other embodiments are formed and arranged in shapes other than lines including rectangular plates, square regions, spiral traces, and so forth. For example, the second capacitive line structures 334, 344, and 354, in some embodiments, are arranged over multiple metal or conductive layers in the circuit 300 similar to an arrangement of elements of an n-channel MOSFET or a metal-insulator-metal capacitor (MIMcap) that span across multiple layers of a circuit.

The circuit 300 illustrates write data lines and capacitive structures such as capacitive line structures 304, 314, 324, 334, 344, and 354 of a memory device 321 in accordance with embodiments of the present disclosure. In general, an architecture for a memory device employing the circuit 300 may include other structures as would be known in this art. For example, while not illustrated, a device according to FIG. 3 may include a row or write data driver, a column or bitline driver, and memory cells. As shown by FIG. 3, the memory cell lines are arranged into rows and columns where each column or row represents a string of data bits, also referred to a word or byte.

While the first set of capacitive line structures 304, 314, 324 are illustrated in FIG. 3 as extending parallel to the write data lines, in other embodiments, a first set of capacitive line structures are formed in a same direction as the second set of capacitive line structures parallel to the write data lines. That is, the capacitive line structures 304, 314, 324 lie parallel with the second set of capacitive line structures 334, 344, 345. Further, the capacitive line structures 304, 314, 324, in some embodiments, are formed in a same or in a different metal layer than the capacitive line structures 334, 344, 345, depending on the particular design and application for a particular circuit 300.

FIG. 4 is a block diagram of a cross-sectional view along line 1-1 of FIG. 1 in accordance with some embodiments. A circuit 400 includes a base layer 401 upon which other circuit layers are fabricated. Metal layers 402, 404, 406, 408, 410 are interleaved with insulative layers 403, 405, 407, 409 to form the circuit 400. While five metal layers are illustrated, any number of metal and insulative layers may be fabricated together to form transistors, inverters, vias, capacitive line structures, and other elements as known to those in the art. Structures of a memory cell (not shown) are fabricated in the lower layers 411 or in layers above a top surface 413 of the fifth metal layer 410. The first capacitive line structure 115 labeled "CAP 1" is fabricated in the fourth metal layer 408. The bitline 113 and the bitline complement 114 are also fabricated in the fourth metal layer 408. The via 120 is fabricated in, through, or in and through the fourth insulative layer 409. The second capacitive line structure 116 labeled "CAP 2" is fabricated in the fifth metal layer 410. Write data lines, while not illustrated in FIG. 4, would lie parallel with the second capacitive line structure 116 in the fifth metal layer 410 and would couple to a write data line driver at a first edge 412 of the fifth metal layer 410 of the circuit 400. As shown in FIG. 4, additional capacitance for a capacitive boost for a bitline write assist is facilitated by a combination of the first capacitive line structure 115 electrically coupled to the second capacitive line structure 116 for an improved capacitive boost to a memory cell coupled to the bitline 113 and the bitline complement 114.

Figure 5:
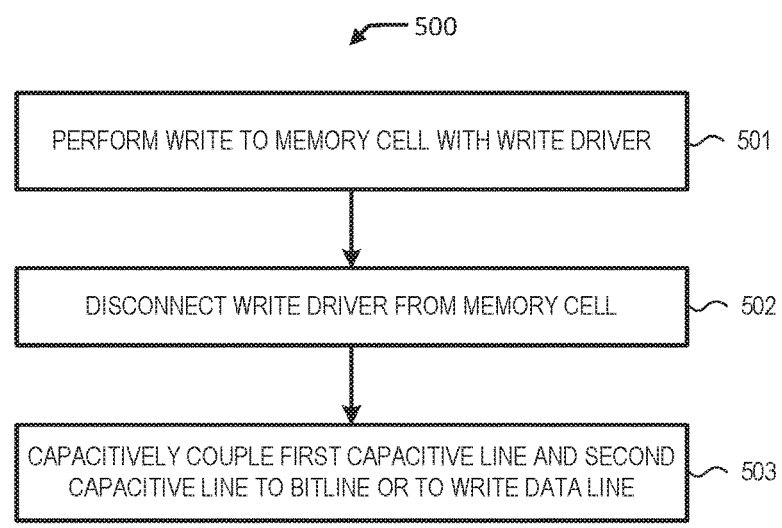
FIG. 5 is a flowchart of a method of using capacitive structures for memory cells in accordance with some embodiments.

FIG. 5 illustrates a method 500 of operating a memory cell of a memory device using bitlines or write data lines with capacitive structures in accordance with some embodiments. For ease of illustration, the method 500 is described with reference to the example embodiment of the memory device 100 of FIG. 1. At block 501, a write operation is performed to the memory cell by application of a memory voltage to the write data line, the bitline, or a combination of the write data line and the bitline. At block 502, the memory voltage is disconnected from the memory cell. At block 503, a first capacitive line structure and a second capacitive line structure are coupled to a bitline such as bitline 113 or are coupled to a write data line such as WD2 118 of FIG. 1. The first capacitive line structure is coupled, for example, by way of an interlayer via to the second capacitive line structure. The first capacitive line structure and the second capacitive line structure provide a negative write assist voltage to the memory cell.

While top, bottom, left, right, vertical, and horizontal are used herein, these directional terms are only for convenience in reference to the orientation shown in the corresponding figure and are not necessarily in reference to a fixed reference frame, such as reference to gravity or the horizon. Unless otherwise indicated, such referential terms for one component are only in reference to another component, especially in terms of describing one component in reference to the other component in a particular figure. Columns of memory cells and rows of memory cells may be illustrated in a vertical orientation or a horizontal orientation relative to the corresponding figure. Likewise, rows of memory cells may be illustrated in a horizontal orientation or a vertical relative to the corresponding figure.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A memory device comprising:
a set of memory cells;
a first capacitive line structure of a first metal layer, the first capacitive line structure coupled to the set of memory cells, wherein the first capacitive line structure is substantially linear in a first direction in the first metal layer;
a second capacitive line structure of a second metal layer, the second capacitive line structure coupled to the set of memory cells, wherein the second capacitive line structure is substantially linear in a second direction in the second metal layer, the second direction being substantially perpendicular to the first direction;
a via electrically coupling the first capacitive line structure to the second capacitive line structure during a write operation; and
a write assist component coupled to the set of memory cells and to at least one of the first capacitive line structure and the second capacitive line structure, the write assist component configured to selectively couple the first capacitive line structure and the second capacitive line structure to a memory cell of the set of memory cells thereby applying a write assist voltage to at least one of the memory cells during the write operation.

2. The memory device of claim 1, wherein the write assist component couples the first capacitive line structure to the memory cell prior to coupling the second capacitive line structure to the memory cell.

3. The memory device of claim 1, wherein the first metal layer is separated from the second metal layer by an insulative layer.

4. The memory device of claim 1, wherein the write assist component is further configured to capacitively couple one or more of the first capacitive line structure and the second capacitive line structure to one of a plurality of physical bitline lines during the write operation.

5. The memory device of claim 1, further comprising:
a first bitline and a first bitline complement in the first metal layer, wherein the first capacitive line structure or the second capacitive line structure lies adjacent and parallel to one of the first bitline and the first bitline complement.

6. The memory device of claim 5, further comprising:
a second bitline and a second bitline complement in the first metal layer, wherein the first capacitive line structure or the second capacitive line structure lies adjacent and parallel to one of the second bitline and the second bitline complement.

7. An apparatus comprising:
a bitcell including structures for storing a bit value;
a first pair of bitlines coupled to the bitcell, the first pair of bitlines in a first metal layer;
a pair of write data (WD) lines;
a first capacitive line adjacent to one of the pair of WD lines;
a second capacitive line adjacent to another of the pair of WD lines;
a first via that electrically couples the first capacitive line to the second capacitive line; and
a write assist component coupled to the first pair of bitlines, the pair of WD lines, and at least one of first capacitive line and the second capacitive line to apply a negative voltage to the first pair of bitlines during a negative write assist operation.

8. The apparatus of claim 7, wherein the first capacitive line is in the first metal layer, and wherein at least one of the pair of WD lines is in a second metal layer.

9. The apparatus of claim 8, wherein the first metal layer is separated by a single insulative layer relative to the second metal layer.

10. The apparatus of claim 7, wherein the first capacitive line is substantially perpendicular to the second capacitive line.

11. The apparatus of claim 7, wherein the first capacitive line is in a different metal layer relative to a metal layer of the second capacitive line.

12. The apparatus of claim 7, further comprising:
a write data driver, coupled to the first pair of bitlines to drive the first pair of bitlines in response to a state of a signal provided to the write data driver, the write data driver to use the first capacitive line and the second capacitive line for a write assist operation to the bitcell.

13. The apparatus of claim 7, further comprising:
a plurality of bitcell columns arranged in parallel, the bitcell in a first column of the plurality of bitcell columns; and
a column selector component operable to select one of the plurality of bitcell columns in response to a column select signal.

14. The apparatus of claim 7, wherein the first capacitive line is substantially linear in a first direction in a first device layer, wherein the second capacitive line is substantially linear in a second direction in a second device layer, the second direction being substantially perpendicular to the first direction.

15. A method of operating a memory cell of an integrated circuit die, the method comprising:
disconnecting the memory cell from a write driver; and after disconnecting the memory cell from the write driver, simultaneously capacitively coupling a first capacitive line oriented in a first direction and a second capacitive line oriented in a second direction to a bitline or a bitline complement of the memory cell to provide a negative write assist voltage to the memory cell.

16. The method of claim 15, further comprising:

providing a negative write assist signal to provide the negative write assist voltage to the memory cell; and writing a zero value or a one value into the memory cell.

* * * * *